United States Patent [19]
Rusu et al.

[11] Patent Number: 5,581,473
[45] Date of Patent: Dec. 3, 1996

[54] METHOD AND APPARATUS FOR MANAGING TIMING REQUIREMENT SPECIFICATIONS AND CONFIRMATIONS AND GENERATING TIMING MODELS AND CONSTRAINTS FOR A VLSI CIRCUIT

[75] Inventors: Stefan Rusu, Sunnyvale; Stuart A. Taylor, Palo Alto; Peter C. Tong; Gregory Schulte, both of Mountain View, all of Calif.

[73] Assignee: Sun Microsystems, Inc., Mountain View, Calif.

[21] Appl. No.: 605,800

[22] Filed: Feb. 23, 1996

Related U.S. Application Data

[63] Continuation of Ser. No. 86,179, Jun. 30, 1993, abandoned.

[51] Int. Cl.⁶ ................................................. G06F 17/50
[52] U.S. Cl. ........................ 364/490; 364/488; 364/489; 395/601
[58] Field of Search ................................ 364/488, 489, 364/490, 491, 578; 395/500, 600

[56] References Cited

U.S. PATENT DOCUMENTS

| | | | |
|---|---|---|---|
| 4,517,661 | 5/1985 | Graf et al. | 364/900 |
| 4,827,427 | 5/1989 | Hyduke | 364/489 |
| 4,924,430 | 5/1990 | Zasio et al. | 364/578 |
| 5,019,961 | 5/1991 | Addesso et al. | 364/192 |
| 5,050,091 | 9/1991 | Rubin | 364/488 |
| 5,084,824 | 1/1992 | Lam et al. | 364/490 |
| 5,089,985 | 2/1992 | Chang et al. | 395/600 |
| 5,095,454 | 3/1992 | Huang | 364/578 |
| 5,140,526 | 8/1992 | McDermith et al. | 364/488 |
| 5,150,308 | 9/1992 | Hooper et al. | 364/489 |
| 5,164,908 | 11/1992 | Igarashi | 364/491 |
| 5,210,700 | 5/1993 | Tom | 364/489 |
| 5,220,512 | 6/1993 | Watkins et al. | 364/489 |
| 5,222,030 | 6/1993 | Dangeld et al. | 364/489 |
| 5,239,481 | 8/1993 | Brooks et al. | 364/486 |
| 5,272,651 | 12/1993 | Bush et al. | 364/578 |
| 5,278,769 | 1/1994 | Bair et al. | 364/490 |
| 5,333,032 | 7/1994 | Matsumoto et al. | 364/489 |

OTHER PUBLICATIONS

Arya et al, "Automatic Generation of Digital System Schematic Diagrams," 22nd design Automation Conference, 1985, Paper 24.4, pp. 388–395.

Afsarmanesh et al., "The EVE VLSI Information Management Environment," 1989 Int'l Computer–Aided design Conference, pp. 384–387.

Chen et al., "An Intelligent Component Database for Behavioral Synthesis," 1990 27th ACM/IEEE Design Automation Conference, Paper 8.4, pp. 150–155.

Mueller–Glaser et al., "An Approach to Computer–Aided Specification, "IEEE Journal of Solid–State Circuits, vol. 25, No 2, Apr. 1990, pp. 335–345.

Toyoda et al., "A Fully Integrated Characterization ? Management System for ASIC Libraries,"1992 ASIC Conference and Exhibit, pp. 245–248.

*Primary Examiner*—Kevin J. Teska
*Assistant Examiner*—Leigh Marie Garbowski
*Attorney, Agent, or Firm*—Blakely, Sokoloff Taylor & Zafman

[57] ABSTRACT

A repository, a loader, a model generator, a constraint generator, and a number of timing analysis tools, are provided for managing timing requirement specifications and measurements, and generating timing models and constraints of a VLSI circuit. The repository stores the timing specifications and measurements for each pin instances and each flow through arc instances. Timing specifications and measurements are identified by their classes including at least one current specification class and at least one measurement class for one timing analysis tool. Additionally, the repository stores a number of characteristics for each pin instance, the pin compositions of each net, and the hierarchical relationship of the functional block instances. The loader loads the various information into the repository. The timing model generator generates the timing models for the various functional blocks, using the stored information in the repository. The timing constraint generator in cooperation with the timing model generator and at least one timing analysis tool generates the timing constraints for the various functional block instances, using the stored information in the repository, the generated timing models of the functional blocks, and a number of timing analysis scripts.

21 Claims, 8 Drawing Sheets

PIN TIMING INFORMATION TABLE

| Block Instance | Pin Name | Class | Setup Rise | Setup Fall | Hold Rise | Hold Fall | Clock To Output-Q Rise & Fall | Capacitance | Driver Resist. High | Driver Resist. Low |
|---|---|---|---|---|---|---|---|---|---|---|
| | | | | | | | | | | |

FLOW THROUGH ARC TIMING TABLE

| Block Instance | From Pin | To Pin | Class | Rise | Fall |
|---|---|---|---|---|---|
| | | | | | |

PIN CHARACTERISTIC TABLE

| Block Instance | Pin Name | Pin Type | Position Order of Ports |
|---|---|---|---|
| | | | |

NET TABLE

| Net Name | Block Instance | Pin Name |
|---|---|---|
| | | |

HIERARCHY TABLE

| Block Name | Functional Block Instance | Parent Block Instance |
|---|---|---|
| | | |

PIN TIMING CONSTRAINT TABLE

| Block Instance | Pin Name | Class | Setup Rise | Setup Fall | Hold Rise | Hold Fall | Clock To Output-Q Rise & Fall | Capacitance | Driver Resist. High | Driver Resist. Low |
|---|---|---|---|---|---|---|---|---|---|---|
| | | | | | | | | | | |

PIN TIMING INFORMATION TABLE

| Block Instance | Pin Name | Class | Setup Rise | Setup Fall | Hold Rise | Hold Fall | Clock To Output-Q Rise & Fall | Capacitance | Driver Resist. High | Driver Resist. Low |
|---|---|---|---|---|---|---|---|---|---|---|
| | | | | | | | | | | |
| | | | | | | | | | | |

FLOW THROUGH ARC TIMING TABLE

| Block Instance | From Pin | To Pin | Class | Rise | Fall |
|---|---|---|---|---|---|
| | | | | | |
| | | | | | |

PIN CHARACTERISTIC TABLE

| Block Instance | Pin Name | Pin Type | Position Order of Ports |
|---|---|---|---|
| | | | |
| | | | |

NET TABLE

| Net Name | Block Instance | Pin Name |
|---|---|---|
| | | |
| | | |

HIERARCHY TABLE

| Block Name | Functional Block Instance | Parent Block Instance |
|---|---|---|
| | | |
| | | |

*Fig. 5*

PIN TIMING CONSTRAINT TABLE

| Block Instance | Pin Name | Class | Setup Rise | Setup Fall | Hold Rise | Hold Fall | Clock To Output-Q Rise & Fall | Capacitance | Driver Resist. High | Driver Resist. Low |
|---|---|---|---|---|---|---|---|---|---|---|
| | | | | | | | | | | |
| | | | | | | | | | | |

NET A = {P1, P2, P3, P4}

METHOD AND APPARATUS FOR MANAGING TIMING REQUIREMENT SPECIFICATIONS AND CONFIRMATIONS AND GENERATING TIMING MODELS AND CONSTRAINTS FOR A VLSI CIRCUIT

This is a continuation of application Ser. No. 08/086,179 filed Jun. 30, 1993 now abandoned.

BACKGROUND OF THE INVENTION

1. Field of the Invention

The present invention relates to the field of integrated circuit design, in particular, design of very large scale integration (VLSI) circuits. More specifically, the present invention relates to managing timing requirement specifications and measurements, and generating timing models and constraints for a VLSI circuit.

2. Background

Today, many VLSI circuits including microprocessors are designed using a top down approach. Under the top down approach, a VLSI circuit is specified as an hierarchy of functional block instances. A functional block instance is an instance of a functional block. For examples, register files "reg1" and "reg2" are functional block instances of the register file "reg" functional block. The hierarchy starts with a root block instance and has one or more generation of offspring block instances. The root block instance represents the total aggregation of the functionalities of the VLSI circuit, whereas the different generations of offspring block instances represent varying degrees of decomposition of the various functions of the VLSI circuit. The immediate ancestor of a number of offspring block instances is referred to as the parent block instance of the particular offspring block instances, and the particular offspring block instances are referred to as the child block instances of the particular parent block instance. A functional block instance with no offspring block instance is also referred to as a leaf block instance. A leaf block instance may or may not be at the gate level, depending on the needs of the designers. Additionally, a collection of connected pin instances, typically spanning over a number of functional block instances, is referred to as a net. The functional block instances of a portion of an hierarchical representation of an exemplary microprocessor is illustrated in FIG. 8. A net of the exemplary microprocessor is illustrated in FIG. 9.

The design starts with specifying or budgeting the requirements of the various functional blocks, from top to bottom, including the behavior, power consumption, physical area, and timing requirements of each of the functional block. The requirements specified for a functional block apply to all its instances. As the leaf blocks are designed or implemented with actual circuit elements, attempts are made to measure and confirm that indeed the various requirements of the functional blocks are met for all functional block instances, using a bottom up process. If the specified requirements are not being met, either the design/implementation of the leaf blocks are altered or the specifications are changed reallocating the requirements among the various functional blocks.

In order to be able to specify the timing requirements and subsequently confirm the timing requirements are being met using the above described top down approach and bottom up process, the timing specifications of the various functional blocks and the measurements of the various functional block instances must be stored and compared. Preferably, not only the current timing specifications and measurements are stored, but all historical timing specifications and measurements are stored and maintained.

Traditionally, the timing requirement specifications and measurements are maintained in an ad hoc manner. The timing measurements are taken using a number of commercially available timing analyzers, such as static timing analyzers, SPICE, and synthesis tools. These timing analysis tools are provided with models of the various functional blocks and constraints of the various functional block instances, which are also generated in an ad hoc manner. However, as the complexity of VLSI circuits continue to increase with increasing number of electronic elements, functional blocks and instances, this ad hoc manner of managing timing requirement specifications and measurements for the functional blocks/block instances, and generating timing models and constraints of the functional blocks/block instances, has become increasing inefficient and unacceptable.

Today, it is not uncommon to find a VLSI circuit involving electronic elements in the order of millions, and functional blocks in the order of hundreds. Due to the number of designers involved, it is also not unusual for designers of some of the functional blocks to work in semi-isolation from designers of other functional blocks. Thus, it is desirable to be able to manage the timing requirement specifications and measurements for the functional blocks/block instances, and generate timing models and constraints of the functional blocks/block instances in a systematic manner, allowing timing requirement specification including their confirmation and adjustment to be performed in an efficient manner. As will be disclosed, the present invention provides for such a method and apparatus which advantageously achieves the desired results.

SUMMARY OF THE INVENTION

The desired results are advantageously achieved by providing a repository, a loader, a model generator, a constraint generator, and a number of timing analysis tools for managing timing requirement specifications and measurements, and generating timing models and constraints for a VLSI circuit. The repository stores the timing specifications and measurements for each pin instances and each flow-through arc instances each flow-through-arc instance is identified by a functional block instance name and the "from" and "to" pin names of a flow through arc instance. Timing specifications and measurements are identified by their classes including at least one current specification class and at least one measurement class for one timing analysis tool. Additionally, the repository stores a number of characteristics for each pin instance, the pin compositions of each net, and the hierarchical relationship of the functional block instances.

The loader loads the various information into the repository. The timing model generator generates the timing models for the various functional blocks, using the stored information in the repository. The timing constraint generator in cooperation with the timing model generator and at least one timing analysis tool generates the timing constraints for the various functional block instances, using the stored information in the repository, the generated timing models of the functional blocks, and a number of timing analysis scripts. Both the timing models and the timing constraints generated for the various functional blocks/block instances are timing analysis tool dependent. In the presently preferred embodiment, commercially available timing analysis tools are used.

BRIEF DESCRIPTION OF THE DRAWINGS

The objects, features, and advantages of the present invention will be apparent from the following detailed description of the presently preferred and alternate embodiments of the invention with references to the drawings in which:

FIG. 5 illustrates one embodiment of the various tables of the repository of FIG. 4.

DETAILED DESCRIPTION PRESENTLY PREFERRED AND ALTERNATE EMBODIMENTS

In the following description, for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1:
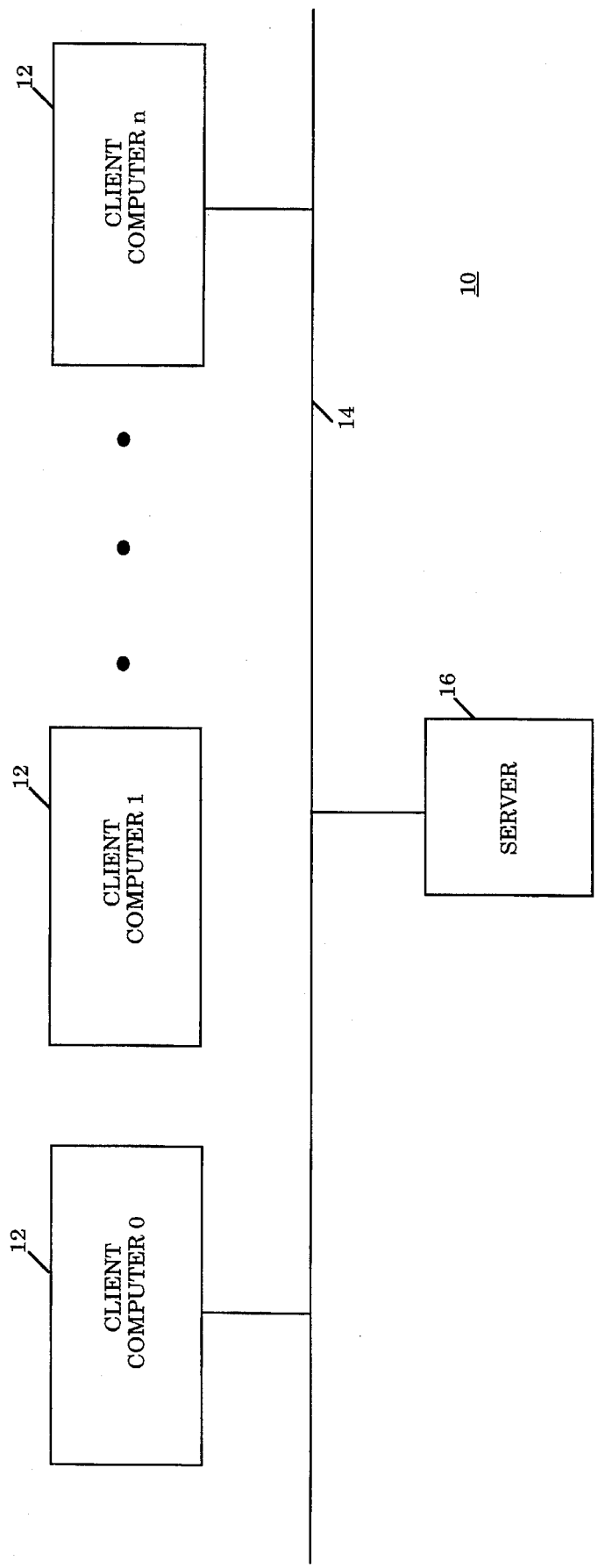
FIG. 1 is a system view of an exemplary network of computers embodying the teachings of the present invention.

Referring now to FIG. 1, a block diagram illustrating an exemplary network of computers embodying the teachings of the present invention is shown. The exemplary network of computers 10 comprises a number of client computers 12, and at least one server 16, coupled to each other through for example a network 14. The designers of a VLSI circuit design or implement the leaf blocks of the VLSI circuit on the client computers 12 using the timing requirement specification and measurement management support provided by the at least one server 16 in accordance to the teachings of the present invention. The exemplary network of client/ server computers 10 is intended to represent a broad category of computer configurations. Based on the description to follow, it will be appreciated that the present invention may be practiced with one or more computers.

Figure 2:
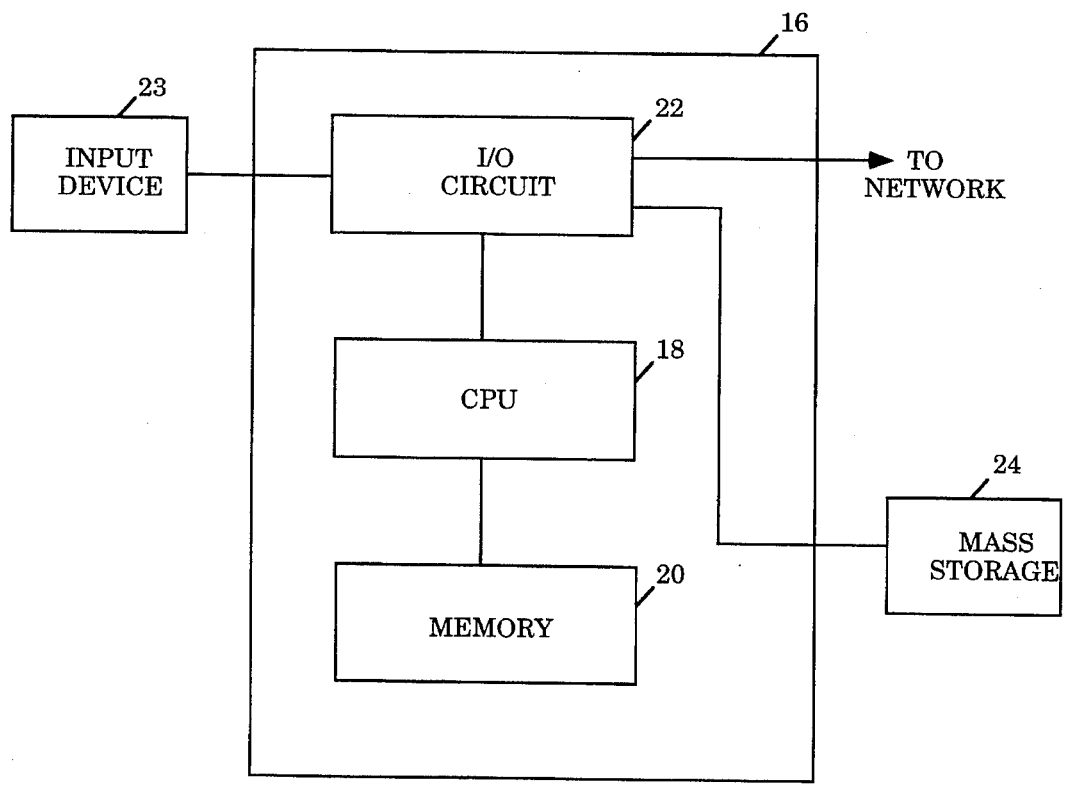
FIG. 2 illustrates one embodiment of the server of FIG. 1 in further detail.

Referring now to FIG. 2, a block diagram illustrating the exemplary server computer of FIG. 1 in further detail is shown. The exemplary server computer 16 comprises a CPU 18, a memory 20, an I/O circuit 22, an input device 23, and a mass storage 24. The memory 20 and the I/O circuit 22 are coupled to the CPU 18, whereas, the input device 23 and the mass storage 24 are coupled to the I/O circuit 22. These elements 18–24 are intended to represent a broad categories of CPU, memory, etc. found in most computer systems. Their constitutions and functions are well known and will not be further described.

Figure 3:
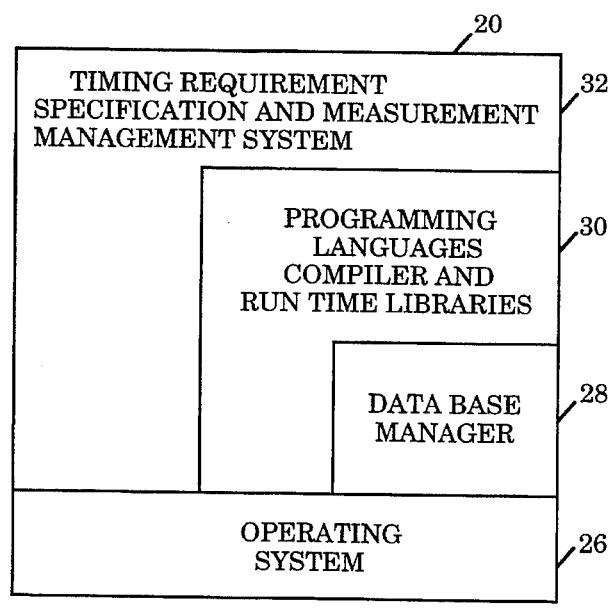
FIG. 3 illustrates the contents of the memory of FIG. 2 in further detail.

Referring now to FIG. 3, a block diagram illustrating the content of the memory 20 of the exemplary server computer 16 of FIG. 2 in further detail is shown. Shown is an operating system 26, a database manager 28, a number of programming language compilers and runtime libraries 30, and the timing requirement specification and measurement management system (TRSAMMS) 32 of the present invention. TRSAMMS 32 will be described in further detail below with additional references to the remaining figures. The operating system 26, the database manager 28, and the compilers and runtime libraries 30 provide various system and subsystem services to TRSAMMS 32. Preferably, the database manager 28 provides a flexible, multi-user interface, allowing TRSAMMS 32 to support multiple concurrent clients. These elements 26–30 are intended to represent a broad category of system and subsystem software. Their constitutions and functions are also well known and will not be described further. Additionally, based on the descriptions to follow, it will be appreciated that the present invention may be practiced with other supporting system and sub-system software.

Figure 4:
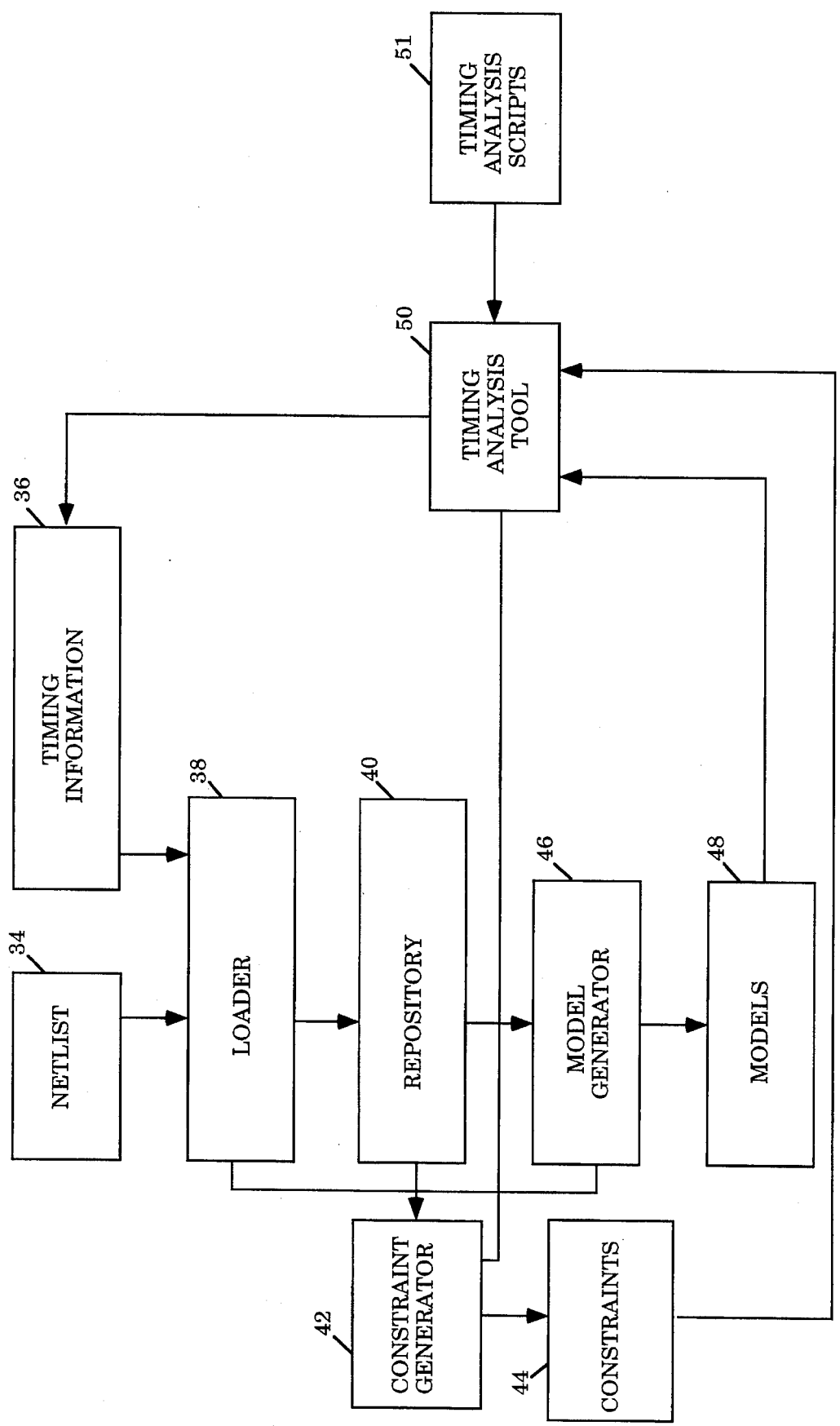
FIG. 4 illustrates the major functional blocks of the timing requirement specification and measurement management system (TRSAMMS) of the present invention.

Referring now to FIG. 4, a block diagram illustrating the TRSAMMS of the present invention is shown. TRSAMMS 32 comprises a repository 40, a loader 38, a model generator 46, a constraint generator 42, and a number of timing analysis tools 50. The repository 40 stores the timing specifications and measurements for each pin instance and each flow-through arc instance. Timing specifications and measurements are identified by their classes including at least one current specification class and at least one measurement class for one timing analysis tool 50. Additionally, the repository 40 stores a number of characteristics for each pin instance, the pin compositions of each net, and the hierarchical relationship of the functional block instances.

The loader 38 in response to netlist and timing information inputs 34 and 36 loads the various information into the repository 40. The netlist 34 comprises the pin instances of the various nets of the VLSI circuit. The timing information 36 comprises the initial and adjusted timing requirement specifications of the functional blocks, and timing measurements of the functional block instances generated by the timing analysis tools 50. Preferably, the loader 38 is capable of propagating timing values from input pins of a net to some of the other pins in the same net, thereby reducing the amount of timing information inputs has to be provided for loading. The netlist 34 and the initial and adjusted timing requirement specifications 36 may be implemented in a variety of formats known to the loader 38. The timing measurements 36 generated by the various timing analysis tools 50 are tool dependent. For commercially available timing analysis tools 50, it is well within the ability of one skill in the art to implement the loader 38 to extract the appropriate timing information to be described from the timing measurement outputs, since their timing measurements output formats are well known. For custom built timing analysis tools 50, preferably the timing measurement output formats are implemented in a manner that is easy for the loader 38 to extract the timing measurement information to be described.

The timing model generator 46 generates the timing models 48 for the functional blocks, using the information stored in the repository 40. The constraint generator 44 in cooperation with the timing model generator and at least one timing analysis tool 50 generates the timing constraints 44 for the functional block instances, using the information stored in the repository 40, the generated timing models 48 of the functional blocks, and a number of timing analysis scripts 51. Timing constraints 44 are generated for functional block instances since the connected pin instances constraining a pin instance may differ from one instance to another instance of a functional block. Both the timing models 48 and the timing constraints 44 generated for the various functional blocks/block instances are timing analysis tool 50 dependent. Timing analysis tools 50 are well known in the art and will not be further described. Preferably, commercially available timing analysis tools with well known and easy to work with timing measurement output formats are used.

Referring now to FIG. 5, a block diagram illustrating one embodiment of the various tables of the repository of TRSAMMS is shown. In this embodiment, the repository 40 comprises a pin timing information table 74, a flow-through arc timing information table 76, a pin characteristic table 78, a net table 80, an hierarchy table 82, and a pin timing constraint table 83. The tables 74–83 are managed as relational tables by a relational database manager (not shown).

The pin timing information table 74 comprises the current and historical timing specifications and measurements for each pin instance. Each pin instance is identified by a functional block instance name and a pin name. The current and historical timing specifications and measurements are differentiated by the class attributes of the entries of the pin timing information table 74. In this embodiment, it is assumed that the functional blocks have no transparent latches at their boundaries, and the system clock is a single edge clock, thereby streamlining the timing values to reference just one edge of a single clock. The timing information comprises the set up rise and fall time, the hold rise and fall time, and the clock-to-output-q rise and fall time. Preferably, the timing information further comprises the capacitance, and the driver resistance high and low values, since they are often required as part of the timing models 48 of the functional blocks by the timing analysis tools 50.

The flow through arc timing information table 76 comprises the current and historical flow-through arc timing specifications and measurements for each flow-through arc instance. Each flow through arc instance is identified by a functional block instance name, and the "from" and "to" pin names of a flow-through arc instance. The current and historical flow through timing specifications and measurements are differentiated by the class attributes of the entries of the flow-through arc timing information table 74. The timing specifications and measurements comprise the rise and fall timing values.

The pin characteristic table 78 comprises the pin characteristic for each pin instance. Similarly, each pin instance is identified by a functional block instance name and a pin name. The pin characteristics comprise the pin types, and the pin instance' port position order. Pin types comprise the "In" pin type, the "Out" pin type, and the "In/Out" pin type.

The net table 80 comprises the pin instances of each net. Each net is identified by its name. Again, each pin instance is identified by a functional block instance name and a pin name. The hierarchy table 82 comprises the hierarchical relationship of the functional block instances. Each functional block is identified by a functional block name. Each functional block instance is identified by a functional block instance name. A parent block instance is identified by its functional block instance name. The pin timing constraint table 83 is a working table used during timing constraint generation. It is similarly constituted as the pin timing information table 74. The timing constraint generation process and the usage of the pin timing constraint table 83 will be described in further detail below.

Figure 6:
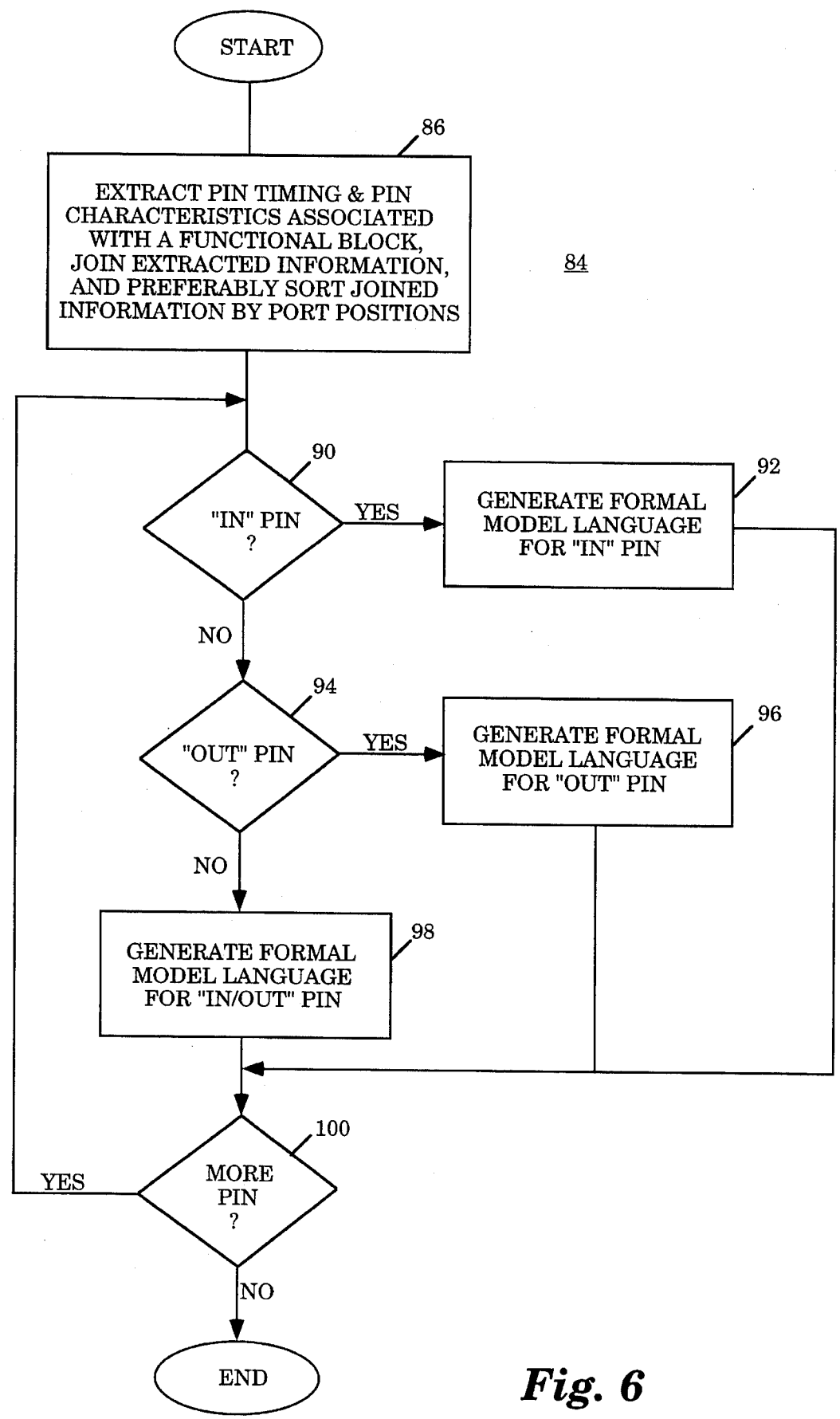
FIG. 6 illustrates the operational flow of the timing model generator of FIG. 4 for generating a timing model for a functional block of the VLSI circuit.

Referring now to FIG. 6, a block diagram illustrating the operational flow of the timing model generator of TRSAMMS for generating a timing model for a functional block of the VLSI circuit is shown. Initially, for the above described embodiment of the repository, the timing model generator extracts the pin timing specifications/measurements of a particular specification/measurement class and pin characteristics associated with a particular functional block instance, joins the extracted information for the pin members of the functional block, and preferably sorts the joined information by the pin members' port positions, step 86. The timing model generator extracts the information by matching the functional block instance name and the specification/measurement class against the entries of the pin timing information table, and by matching the functional block instance name against the entries of the pin characteristics table. The functional block instance name and the specification/measurement class are provided to the timing model generator as inputs. It will be appreciated that for the above described embodiment of the repository, the extraction, joining, and sorting substeps can be performed using a single Structured Query Language (SQL) statement.

Then, for each pin member of the functional block, the timing model generator generates one or more formal description statements based on its pin type, steps 90–98. The formal description statements are generated based on the extracted timing information and the timing information stored in the flow-through arc timing information table. The timing model generator repeats steps 90–98 until formal description statements have been generated for all pin members of the functional block, step 100. The syntax and the semantics of the formal description statements for the various pin types are timing analysis tool dependent. For commercially available timing analysis tools, it is well within the ability of one skilled in the art to implement the timing model generator to generate the various description statements, since the description statement language syntax and semantics are well known. For custom built timing analysis tools, preferably the timing analysis tools are implemented with easy to use description statement language syntax and semantics.

Figure 7:
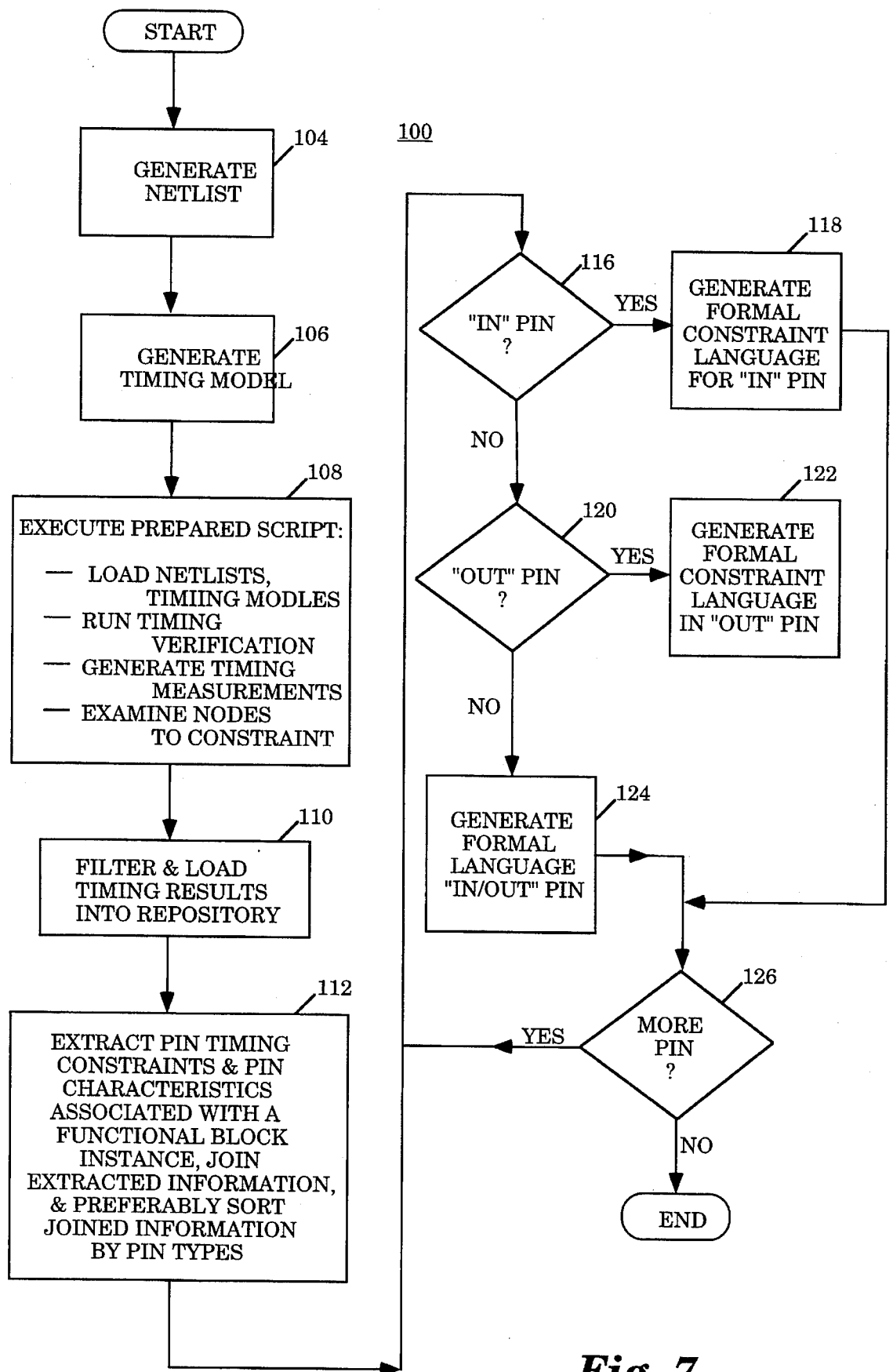
FIG. 7 illustrates the operational flow of the timing constraint generator of FIG. 4 for generating timing constraints for a functional block instance of the VLSI circuit.
Figure 8:
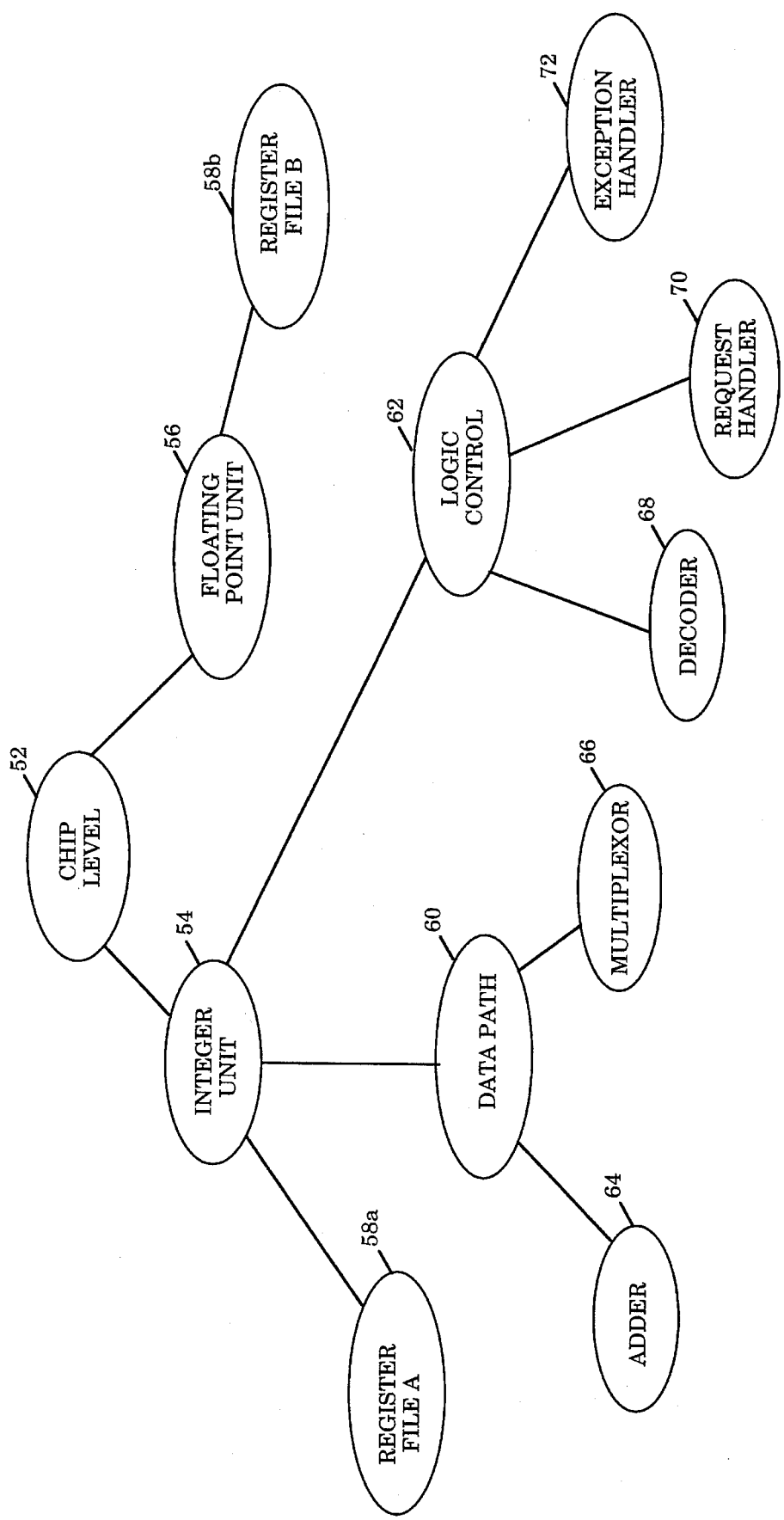
FIG. 8 illustrates the functional block instances of a portion of an hierarchical representation of an exemplary VLSI circuit.
Figure 9:
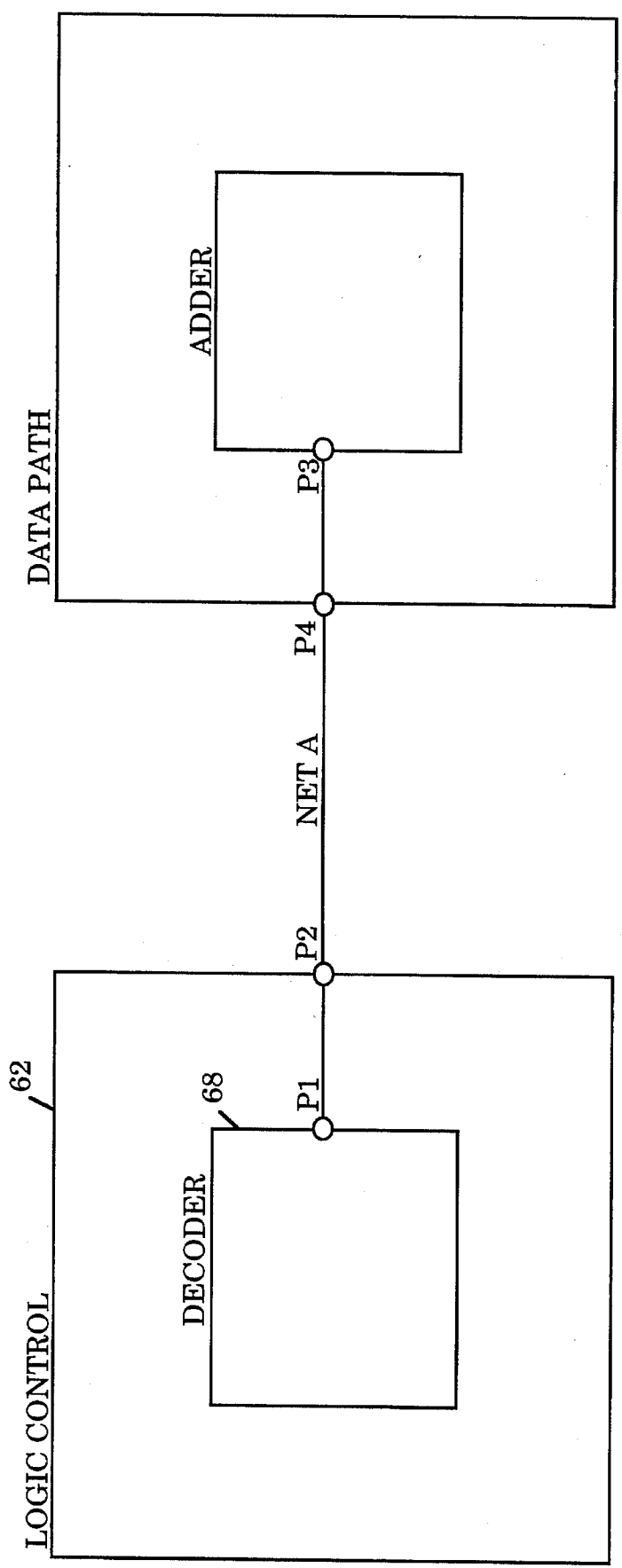
FIG. 9 illustrates a net of the exemplary VLSI circuit.

Referring now to FIG. 7, a block diagram illustrating the operational flow of the timing constraint generator of TRSAMMS for generating the timing constraints for a functional block instance is shown. Initially, the timing constraint generator generates a netlist comprising the functional block instance names, the pin names, and their connectivity for all pin members of a net, using the net and hierarchy tables, step 104. The net name is provided to the constraint generator as input and matched against the entries of the net table. The functional block instance names retrieved from the net table are used to access the hierarchy table to determine the pin members' connectivity. The timing constraint generator also causes the timing model generator to generate a timing model for the functional block of the functional block instance as described earlier, step 106. Next, the timing constraint generator causes a prepared timing analysis script to be executed by a timing analysis tool, generating timing measurements and identifying nodes to be constrained for the functional block instance, step 108. The timing analysis script comprises instructions to the timing analysis tool for loading the generated netlist and timing model, running timing verification, generating timing measurements, and identifying nodes to be constrained for the functional block instance. A worst case algorithm is preferably employed to identify the worse case connected input and bidirectional pins for constraining the output and bidirectional pins. Worse case algorithm is not required for the input pins, since each input pin is constrained by only one output pin. However, an alternate embodiment may allow bidirectional and output pins to be constrained by more than one pin.

Then, the timing constraint generator causes the loader to filter and load the generated timing measurements of the functional block instance into the repository, more specifically, the pin timing constraint table for the above described embodiment, step 110. Upon loading the generated timing measurements of the functional block instance, the timing constraint generator extracts the pin timing constraints and pin characteristics associated with a particular functional block instance, joins the extracted information for the pin members of the functional block, and preferably sorts the joined information by the pin members' pin types, step 112. The timing constraint generator extracts the information by matching the functional block instance name against the entries of the pin timing information and pin characteristics tables. The functional block instance name is provided to the timing constraint generator as input. It will be appreciated that for the above described embodiment of the repository, the extraction, joining, and sorting substeps can be performed using a single Structured Query Language (SQL) statement.

Then, for each pin member of the functional block instance, the timing constraint generator generates one or more formal constraint statements based on its pin type, steps 116–124. The formal description statements are generated based on the extracted timing constraints. The timing constraint generator repeats the process until formal constraint statements have been generated for all pin members of the functional block instance, step 126. The syntax and the semantics of the formal constraints statements for the various pin types are timing analysis tool dependent. For commercially available timing analysis tools, it is well within the ability of one skilled in the art to implement the timing constraint generator to generate the various constraint statements, since the constraint statement language syntax and semantics are well known. For custom built timing analysis tools, preferably the timing analysis tools are implemented with easy to use constraint statement language syntax and semantics.

While the present invention has been described in terms of presently preferred and alternate embodiments, those skilled in the art will recognize that the invention is not limited to the embodiments described. The method and method of the present invention can be practiced with modification and alteration within the spirit and scope of the appended claims. The description is thus to be regarded as illustrative instead of limiting on the present invention.

What is claimed is:

1. In a computer system comprising a plurality of client designers designing a VLSI circuit using a top down specification approach and a bottom up confirmation process, an apparatus for managing timing specifications and measurements of said VLSI circuit, and generating timing models and timing constraints for said VLSI circuit, said apparatus comprising:

a) computer-readable repository means for storing a pin timing information table, a pin characteristics table, a net table, a flow-through arc timing information table, and a hierarchy table said VLSI circuit being represented as an hierarchy of functional block instances of a plurality of functional blocks, each functional block having a plurality of pins, said pin instances further being connected to each other forming a plurality of nets;

b) loading means coupled to said computer-readable repository means for receiving information to be stored in said tables of said computer-readable repository means as inputs, and loading said information into said tables of said computer-readable repository means;

c) timing model generation means coupled to said computer-readable repository means for generating timing models of said functional blocks of said VLSI circuit using the information stored in said computer-readable repository means; and d) timing analysis and constraints generation means coupled to said computer-readable repository means, said loading means, and said timing model generation means for generating timing constraints of said functional block instances of said VLSI circuit using the information stored in said computer-readable repository means, using said generated timing models, and causing a plurality of timing analysis scripts to be executed.

2. The apparatus as set forth in claim 1, wherein, said pin timing information table includes timing specification and measurements of said pin instances, said pin characteristic table includes pin characteristics of said pin instances, said net table includes net compositions of said nets, said flow-through arc timing information table includes timing specifications and measurements of a plurality of flow-through arc instances, and said hierarchy table includes functional block instance hierarchical relationships.

3. The apparatus as set forth in claim 2, wherein, said pin timing information table further comprises a class attribute field for storing entries corresponding to each of said timing specifications and measurements of said pin instances, said entries distinguishing between the current and historical timing specifications and measurements of said pin instances; and said flow-through arc timing information table further comprises a class attribute field for storing entries corresponding to each of said timing specifications and measurements of said flow-through arc instances, said entries distinguishing between the current and historical flow-through arc timing specifications and measurements of said flow-through arc instances.

4. The apparatus as set forth in claim 2, wherein, said functional blocks of said VLSI circuit have no transparent latches at their boundaries, and said VLSI circuit has a single one phased clock;

said pin timing information table comprises a functional block instance name, a pin name, a set up rise timing value, a set up fall timing value, a hold rise timing value, a hold fall timing value, and clock-to-output-q rise and fall timing values for each pin instance;

said flow-through arc timing information table comprises a functional block instance name, a flow-through arc "from" pin name, a flow-through arc "to" pin name, a flow-through arc rise timing value, and a flow-through arc fall timing value for each flow-through arc instance;

said pin characteristics table comprises a functional block instance name, a pin name, a pin type, and an ordered port position for each pin instance;

said net table comprises a net name, a functional block instance name, and a pin name for each pin of a net;

said hierarchy table comprises a functional block name, a functional block instance name, and a parent functional block instance name for each functional block instance.

5. The apparatus as set forth in claim 4, wherein, said pin timing information table further comprises a capacitance value, a driver resistance high value, and driver resistance low value for each of a subset of said pin instances of said VLSI circuit.

6. The apparatus as set forth in claim 2, wherein, said computer-readable repository means further comprises a pin timing constraint table for storing timing constraints of said pin instances, said pin timing constraint table being used by said timing analysis and constraints generation means for generating timing constraints for a functional block instance of said VLSI circuit.

7. The apparatus as set forth in claim 6 wherein said pin timing constraint table comprises a functional block instance name, a pin name, a set up rise timing value, a set up fall timing value, a hold rise timing value, a hold fall timing value, and clock-to-output-q rise and fall timing value for each pin instance.

8. The apparatus as set forth in claim 1, wherein, said timing model generation means generates timing models of said functional blocks by extracting pin timing information and pin characteristics associated with the functional blocks, joining said extracted information, and sorting said joined information by the pins' port positions.

9. The apparatus as set forth in claim 1, wherein, said timing analysis and constraints generation means comprises d.1) timing analysis means for running timing verifications and generating timing measurements for said functional block instances in response to net lists, timing models of said functional blocks, and said timing analysis scripts; and d.2) timing constraints generation means, coupled to said loading means, said computer-readable repository, and said timing analysis means, for generating said net lists, for causing said timing model generation means to generate said timing models of said functional blocks, for causing said timing analysis means to execute said timing analysis scripts thereby generating timing measurements of said functional block instances, for identifying nodes, of said functional block instances, that are subject to generation of said timing constraints by said timing constraints generation means, for causing said loading means to load said generated timing measurements into said computer-readable repository means, and for generating said timing constraints for said functional block instances in accordance to said functional blocks instances' pins' pin types.

10. The apparatus as set forth in claim 9, wherein, said timing analysis scripts comprise timing analysis instructions to timing analysis tools for loading said net lists and said timing models, running timing verifications, generating timing measurements, and identifying nodes, of said functional block instances, that are subject to generation of said timing constraints by said timing constraints generation means.

11. The apparatus as set forth in claim 1, wherein, said loading means propagates timing information from input pins of a net to other pins of the net.

12. In a computer system comprising a plurality of client designers designing a VLSI circuit using a top down specification approach and a bottom up confirmation process, a computer-implemented method for managing timing specifications and measurements of said VLSI circuit, and generating timing models and timing constraints for said VLSI circuit, said method comprising the steps:

a) receiving information to be stored in a computer-readable repository as inputs, and loading said information into said computer-readable repository, said computer-readable repository having a pin timing information table, a flow-through arc timing information table, a pin characteristics table, a net table, and a hierarchy table;

b) storing said information in said computer-readable repository, wherein said information includes pin timing specifications and measurements for storing in said pin timing information table, flow-through arc instances for storing in a flow-through arc timing information table, pin characteristics for storing in said pin characteristics table, net compositions for storing in said net table, and functional block instance hierarchical relationships of said VLSI circuit for storing in said hierarchy table, said VLSI circuit being represented as an hierarchy of functional block instances of a plurality of functional blocks, each functional block having a plurality of pins, said pin instances further being connected to each other forming a plurality of nets;

c) generating a timing models file of said functional blocks of said VLSI circuit using the information stored in said computer-readable repository; and d) generating a timing constraint table of said functional block instances of said VLSI circuit using the information stored in said pin-timing information table, said flow-through arc timing information table, said pin characteristics table, said net table, and said hierarchy table, using said generated timing models file, and causing a plurality of timing analysis scripts to be executed.

13. The method as set forth in claim 12, wherein, said computer-readable repository further comprises a pin timing constraint table for storing timing constraints of said pin instances, said pin timing constraint table being used by a timing analysis and constraints generation means for generating said timing constraint table for a functional block instance of said VLSI circuit.

14. The method as set forth in claim 13 wherein said pin characteristics table comprises a functional block instance name, a pin name, a pin type, and an ordered port position for each pin instance.

15. The method as set forth in claim 12, wherein, said functional blocks of said VLSI circuit have no transparent latches at their boundaries, and said VLSI circuit has a single one phased clock;

said pin timing information table comprises a functional block instance name, a pin name, a set up rise timing value, a set up fall timing value, a hold rise timing value, a hold fall timing value, and clock-to-output-q rise and fall timing values for each pin instance;

said flow-through arc timing information table comprises a functional block instance name, a flow-through arc "from" pin name, a flow-through arc "to" pin name, a flow-through arc rise timing value, and a flow-through arc fall timing value for each flow-through arc instance;

said net table comprises a net name, a functional block instance name, and a pin name for each pin of a net;

said hierarchy table comprises a functional block name, a functional block instance name, and a parent functional block instance name for each functional block instance;

said computer-readable repository means further comprises a pin timing constraint table including a functional block instance name, a pin name, a set up rise timing value, a set up fall timing value, a hold rise timing value, a hold fall timing value, and clock-to-output-q rise and fall timing values for each pin instance.

16. The method as set forth in claim 15, wherein, said pin timing information table further comprises a capacitance value, a driver resistance high value, and driver resistance low value for each of a subset of said pin instances of said VLSI circuit.

17. The method as set forth in claim 12, wherein, said pin timing information table further comprises a class attribute field for storing entries corresponding to each of said timing specifications and measurements of said pin instances, said entries distinguishing between the current and historical timing specifications and measurements; and said flow-through arc timing information table further comprises a class attribute field for storing entries corresponding to each of said flow-through arc instances, said entries distinguishing between the current and historical flow-through arc timing specifications and measurements of said flow-through arc instances.

18. The method as set forth in claim 12, wherein, said step c) comprises the steps of extracting pin timing information and pin characteristics associated with the functional blocks, joining said extracted information, and sorting said joined information by the pins' port positions.

19. The method as set forth in claim 12, wherein, said step d) comprises the steps of:

d.1) generating net lists of said functional blocks;

d.2) causing timing verifications to be run, causing timing measurements for said functional block instances to be generated, and causing identification of nodes that are subject to generation of said timing constraint table in response to the generation of the net lists, the generation of the timing models file of said functional blocks, and said timing analysis scripts; and d.3) causing said generated timing measurements to be loaded into said computer-readable repository; and d.4) generating said timing constraint table for said functional block instances in accordance to said functional blocks instances' pins' pin types.

20. The method as set forth in claim 19, wherein, said timing analysis scripts comprise timing analysis instructions to timing analysis tools for loading said net lists and said timing models file, running timing verifications, generating timing measurements, and identifying the nodes, of said functional block instances, that are subject to generation of said timing constraint tables.

21. The method as set forth in claim 12, wherein the loading of information into the computer-readable repository comprises propagating timing information from input pins of a net to other pins of the net.

\* \* \* \* \*

UNITED STATES PATENT AND TRADEMARK OFFICE
CERTIFICATE OF CORRECTION

PATENT NO. : 5,581,473
DATED : December 3, 1996
INVENTOR(S) : Rusu et al.

It is certified that error appears in the above-identified patent and that said Letters Patent is hereby corrected as shown below:

<u>Title page,</u>
OTHER PUBLICATIONS,
Reference Arya et al., please delete "$22^{nd}$ design Automation Conference" and insert -- $22^{nd}$ Design Automation Conference --.
Reference Afsarmanesh et al., please delete "Computer-Aided design" and insert -- Computer-Aided Design --.
Reference Toyoda et al., please delete "Characterization ? Management" and insert -- Characterization & Management --.

Signed and Sealed this

Seventh Day of May 2002

*Attest:*

*Attesting Officer*

JAMES E. ROGAN
*Director of the United States Patent and Trademark Office*